(12) United States Patent
Lee et al.

(10) Patent No.: US 8,064,259 B2
(45) Date of Patent: Nov. 22, 2011

(54) NONVOLATILE NAND-TYPE MEMORY DEVICES INCLUDING CHARGE STORAGE LAYERS CONNECTED TO INSULATING LAYERS

(75) Inventors: Changhyun Lee, Gyeonggi-do (KR); Jungdal Choi, Seoul (KR); Yoocheol Shin, Gyeonggi-do (KR); Yongsik Yim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 88 days.

(21) Appl. No.: 12/617,972

(22) Filed: Nov. 13, 2009

(65) Prior Publication Data
US 2010/0128531 A1    May 27, 2010

(30) Foreign Application Priority Data
Nov. 24, 2008    (KR) .................. 10-2008-0116880

(51) Int. Cl.
*G11C 11/34* (2006.01)
(52) U.S. Cl. .......... 365/185.13; 365/185.02; 365/185.05
(58) Field of Classification Search ............. 365/185.13, 365/185.02, 185.05
See application file for complete search history.

(56) References Cited

U.S. PATENT DOCUMENTS

| 7,209,386 B2 | 4/2007 | Yeh |
| 7,310,280 B2 | 12/2007 | Park et al. |
| 2007/0285983 A1 | 12/2007 | Ishii et al. |
| 2008/0144384 A1 * | 6/2008 | Pham et al. .............. 365/185.18 |

FOREIGN PATENT DOCUMENTS

| JP | 2006-024938 | 1/2006 |
| JP | 2006-186359 | 7/2006 |
| JP | 2007-305710 | 11/2007 |
| KR | 1020060060528 | 6/2006 |
| KR | 1020070109825 | 11/2007 |

* cited by examiner

*Primary Examiner* — Thong Q Le
(74) *Attorney, Agent, or Firm* — Myers Bigel Sibley & Sajovec

(57) ABSTRACT

A nonvolatile memory device includes a word line group including a plurality of middle word lines and an edge word line having charge storage patterns on a substrate. A peripheral line is disposed on one side of the word line group so that the edge word line is between the peripheral word line and the middle word lines. The peripheral line includes an insulating layer and a gate electrode. Charge storage patterns of the middle and edge word lines are separated from each other, and a charge storage pattern of the edge word line extends on one side to be connected to the insulating layer of the peripheral line. Methods of forming nonvolatile memory devices are also disclosed.

18 Claims, 21 Drawing Sheets

NONVOLATILE NAND-TYPE MEMORY DEVICES INCLUDING CHARGE STORAGE LAYERS CONNECTED TO INSULATING LAYERS

CROSS-REFERENCE TO RELATED APPLICATIONS

This U.S. non-provisional patent application claims priority under 35 U.S.C. §119 to Korean Patent Application No. 10-2008-0116880, filed on Nov. 24, 2008, the disclosure of which is hereby incorporated herein by reference in its entirety.

BACKGROUND

Embodiments of the present invention relate to semiconductor memory devices and methods of forming the same, and more particularly, to nonvolatile semiconductor memory devices and methods of forming the same.

Generally, semiconductor memory devices can be classified as volatile memory devices or nonvolatile memory devices. Volatile memory devices lose their stored data when their power supplies are interrupted while nonvolatile memory devices retain their stored data even when their power supplies are interrupted. Flash memory devices, which are nonvolatile memory devices, are highly integrated devices developed by combining advantages of an erasable programmable read only memory (EPROM) capable of programming and erasing data and an electrically erasable programmable read only memory (EEPROM) capable of electrically programming and erasing data.

Flash memory devices may be classified as NOR-type flash memory devices or NAND-type flash memory devices. The NAND-type flash memory device is advantageous in highly integrated devices because a plurality of memory cells are controlled at one time as a string. A NAND-type flash memory device includes ground select lines arranged on one side of a group of word lines and string select lines arranged on the other side of the group of word lines.

SUMMARY

A nonvolatile memory device according to some embodiments includes a word line group including a plurality of middle word lines and an edge word line having charge storage patterns on a substrate. A peripheral line is disposed on one side of the word line group, and the edge word line is between the peripheral lines and the middle word lines. The peripheral line may, for example, be a dummy word line, a select line such as a string select line or a ground select line, or some other line that is disposed adjacent the word line group. The peripheral line includes an insulating layer and a gate electrode. Charge storage patterns of the middle word lines are separated from each other, and a charge storage pattern of the edge word line, which is the word line that is arranged at an edge of the word line group and is closest to the peripheral line, extends in one side away from the edge word line and is connected to the insulating layer of the peripheral line.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF EMBODIMENTS

Figure 1:
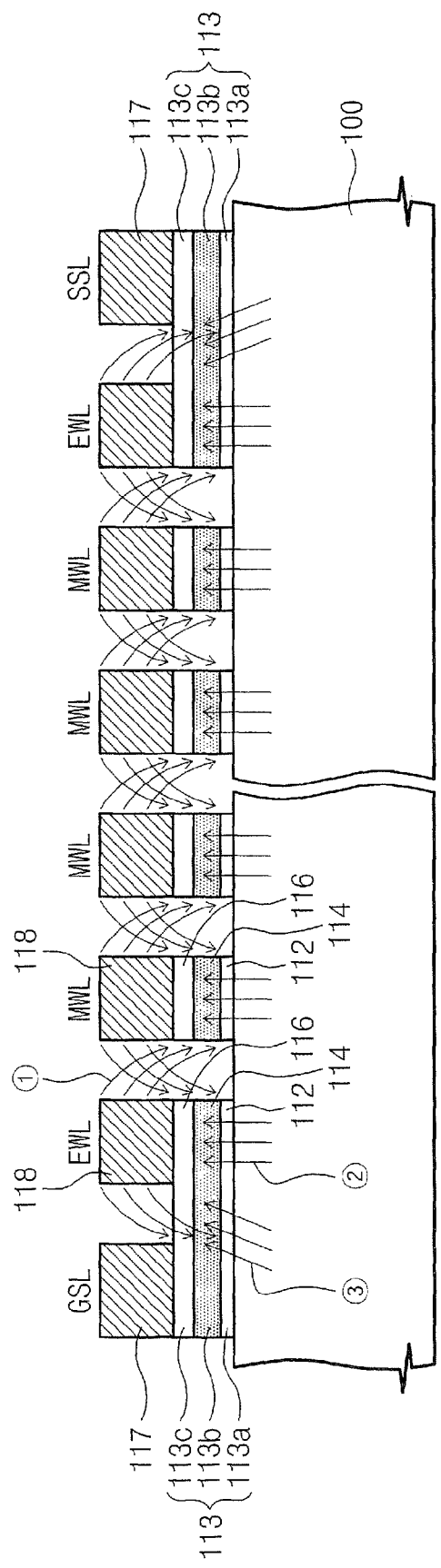
FIGS. 1 through 3 are cross sectional views that illustrate a nonvolatile memory device according to some embodiments.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly. a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

FIG. 1 illustrates a nonvolatile memory device according to some embodiments.

Referring to FIG. 1, a word line group is disposed on a semiconductor substrate 100. Word lines in the word line group include edge word lines (EWL), which are the outermost word lines of the word line group, and middle word lines (MWL), which are disposed between the edge word lines (EWL). Accordingly, the edge word lines (EWL) are the outermost word lines that are furthest word lines from the center of the word line group. A peripheral line including an insulating layer is disposed on at least one side of the word line group. In some embodiments, the peripheral line may be a ground select line (GSL) or a string select line (SSL). In the embodiments illustrated in FIG. 1, one of the edge word lines (EWL) is disposed to be adjacent to the ground select line (GSL) and the other edge word line is disposed to be adjacent to the string select line (SSL). The word line group may include, for example, 8, 16 or 32 word lines, although other numbers of word lines could be present. The middle word lines (MWL) and the edge word lines (EWL) include a tunnel insulating pattern 112, a charge storage pattern 114, a blocking insulating pattern 116 and a gate electrode 118 that are disposed on the semiconductor substrate 100. The semiconductor substrate 100 may include a well region.

The ground select line (GSL) and/or the string select line (SSL) includes an insulating layer 113 and a gate electrode 117 that are sequentially stacked on the substrate 100. The insulating layer 113 may include a material layer 113b including the same material as the charge storage pattern 114. In addition, the insulating layer 113 may further include a lower layer 113a including the same material as the tunnel insulating pattern 112 and an upper layer 113c including the same material as the blocking insulating pattern 116.

The tunnel insulating pattern 112 may include at least one of a silicon oxide layer and a silicon oxynitride layer. A silicon oxide layer constituting the tunnel insulating pattern 112 may have a thickness such that direct tunneling through the tunnel insulating pattern does not readily occur. For example, the tunnel insulating pattern 112 may be formed to be thicker than 25 Å to reduce or prevent direct tunneling across the silicon oxide layer from occurring.

The charge storage pattern 114 may include a silicon nitride layer, a zirconium oxide layer (ZrO), a tantalum oxide layer (TaO), a hafnium silicon oxide layer (HfSiO), a hafnium oxynitride layer (HfON), a zirconium oxynitride layer (ZrON), a hafnium silicon oxynitride layer (HfSiON) and/or a hafnium aluminum oxynitride layer (HfAlON).

The blocking insulating pattern 116 may include a high dielectric layer having a dielectric constant higher than the dielectric constant of the tunnel insulating pattern 112. In some embodiments, the blocking insulating pattern 116 may include an insulating metal oxide layer. For example, the blocking insulating pattern 116 may include an aluminum oxide layer, a lanthanum hafnium oxide layer (LaHfO), a lanthanum aluminum oxide layer (LaAlO) and/or a dysprosium scandium oxide layer (DyScO).

The gate electrode 118 includes a conductive material having a work function of greater than 4 eV. A tunneling probability of a charge moving from the gate electrode 118 to the charge storage pattern 114 through the blocking insulating pattern 116 is in inverse proportion to a work function of the gate electrode 118. As the gate electrode 118 may be formed of a conductive layer having a work function of greater than 4.0 eV, the probability of a charge tunneling through the blocking insulating pattern 116 can be reduced. The gate electrode 118 may, for example, be formed of metal or doped polysilicon, which is an electric conductor having a work function of greater than 4.0 eV. For example, the gate electrode 118 may include doped polysilicon, Ti, TiN, TaN, TaTi, TaSiN, Ta, W, Hf, HfN, Nb, Mo, $RuO_2$, RuO, $Mo_2N$, WN, WSi, NiSi, $Ti_3Al$, $Ti_2AlN$, Pd, Ir, Pt, Co, Cr, CoSi, NiSi and/or AlSi.

The charge storage patterns 114 of the middle word lines (MWL) and the edge word lines (EWL) are separated from each other by respective gaps or trenches between adjacent ones of the middle word lines and edge word lines. However, in some embodiments, the charge storage pattern of at least one of the edge word lines extends on one side of the at least one edge word line away from the word line group, and connects to the insulating layer of the peripheral line adjacent the at least one edge word line. For example, still referring to FIG. 1, the charge storage pattern 114 of the edge word line (EWL) adjacent to the ground select line (GSL) extends on one side and is connected to the insulating layer 113 of the ground select line (GSL) (in particular, to the material layer 113b). That is, a portion of the charge storage pattern 114 of the edge word line (EWL) is disposed between the edge word line (EWL) and the ground select line (GSL). Also, the charge storage pattern 114 of the edge word line (EWL) adjacent to the string select line (SSL) extends on one side and is connected to the insulating layer 113 of the string select line (SSL) (in particular, to the material layer 113b).

In one aspect, the gate electrodes 117 of the ground select line (GSL) and the string select line (SSL) are formed on the insulating patterns of the edge word lines (EWL), including the charge storage patterns 114 thereof, and are spaced laterally apart from the gate electrodes 118 of the edge word lines (EWL).

An erasing voltage may be applied to the word lines (MWL, EWL) and the semiconductor substrate 100 to erase stored data. For example, 0V may be applied to the word line group, and a positive erasing voltage (for example, 20V) may be applied to a well region of the semiconductor substrate 100. The ground select line (GSL) and the string select line (SSL) may be in an electrically floating state. In response to the erasing voltage, charges are injected into the charge storage patterns 114 disposed just under the gate electrodes 118 of the word line group (arrow ②). A space between the word lines of the word line group is narrow and as a result, a fringing electric field (arrow ①) of the word lines (MWL, EWL) affects the erasing speed.

An erasing electric field of the middle word lines (MWL) is strengthened by both fringing electric fields (arrow ①) of adjacent word lines. Charges are stored (arrow ③) in the extended charge storage pattern 114 between an edge word line (EWL) and the ground select line (GSL) and in the extended charge storage pattern 114 between the other edge word line (EWL) and the string select line (SSL) by fringing electric fields (arrow ①) of the edge word line (EWL) adjacent to the ground select line (GSL) and the edge word line (EWL) adjacent to the string select line (SSL).

Charges (holes) are injected into the extended charge storage pattern 114 to improve the erasing speed of the edge word line (EWL). Thus, the erasing voltage may not need to be increased so as to improve the erasing speed of the edge word line (EWL). Accordingly, power consumption of the nonvolatile memory device may be reduced. Also, charges injected into the extended charge storage pattern 114 may flow into the portion of the charge storage pattern 114 disposed just under the gate electrode 118 of the edge word line (EWL).

Charges stored in the extended charge storage pattern 114 can reduce threshold voltages of the edge word lines (EWL) when a read operation is performed. Channels can be easily formed at channel regions of the edge word lines (EWL) by charges stored in the extended charge storage pattern 114. Also, an inversion layer acting as a source/drain can be easily formed in the semiconductor substrate 100 between the one edge word line (EWL) and the ground select line (GSL) and between the other edge word line (EWL) and the string select line (SSL) by charges stored in the extended charge storage patterns 114. Thus, the channels and the inversion layer acting as a source/drain of the edge word line (EWL) can balance with electrical characteristics of channels and sources/drains of the middle word lines (MWL).

If the extended charge storage pattern 114 did not exist, the erasing speed of the edge word line (EWL) would be low as compared with the middle word lines (MWL). Thus, the erasing voltage for erasing the edge word lines (EWL) would have to be increased, which may cause a problem of increasing a power consumption of the device. If power consumption is not increased, unlike the middle word lines (MWL), the edge word line (EWL) is affected from an unsymmetrical edge electric field. Therefore, a threshold voltage of the edge word line (EWL) becomes higher than threshold voltages of the middle word lines (MWL).

Figure 2:
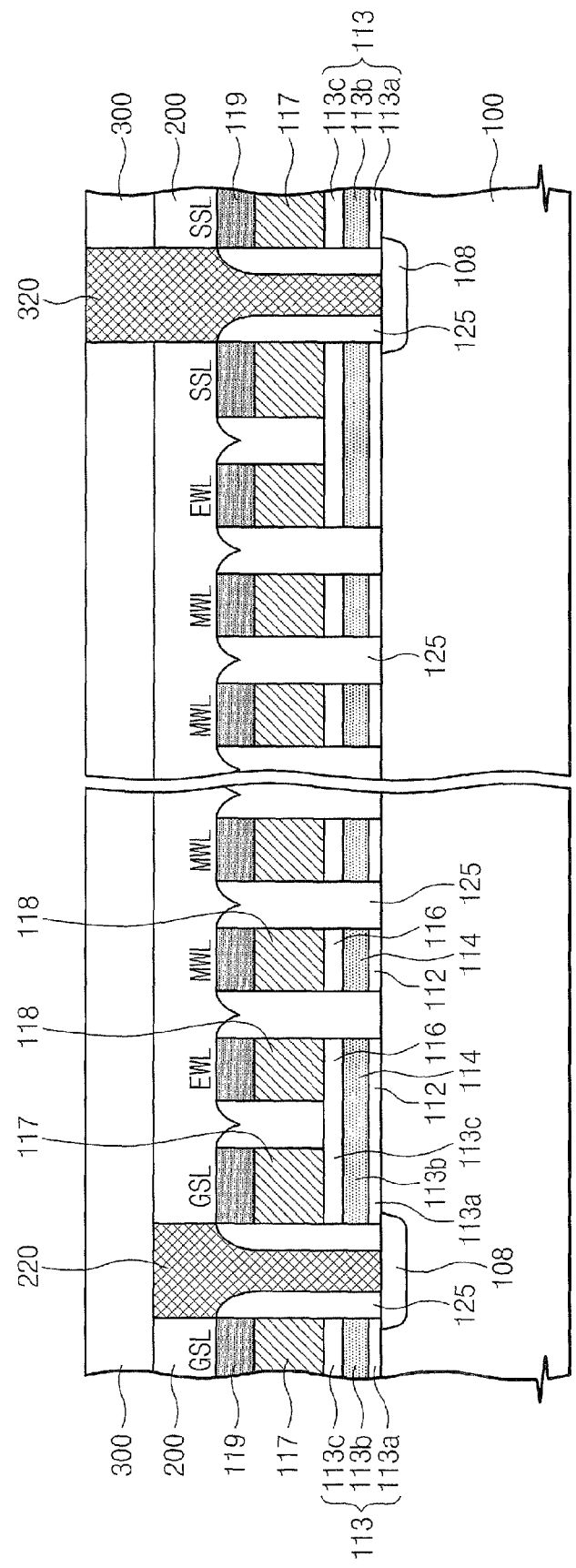
Figure 3:
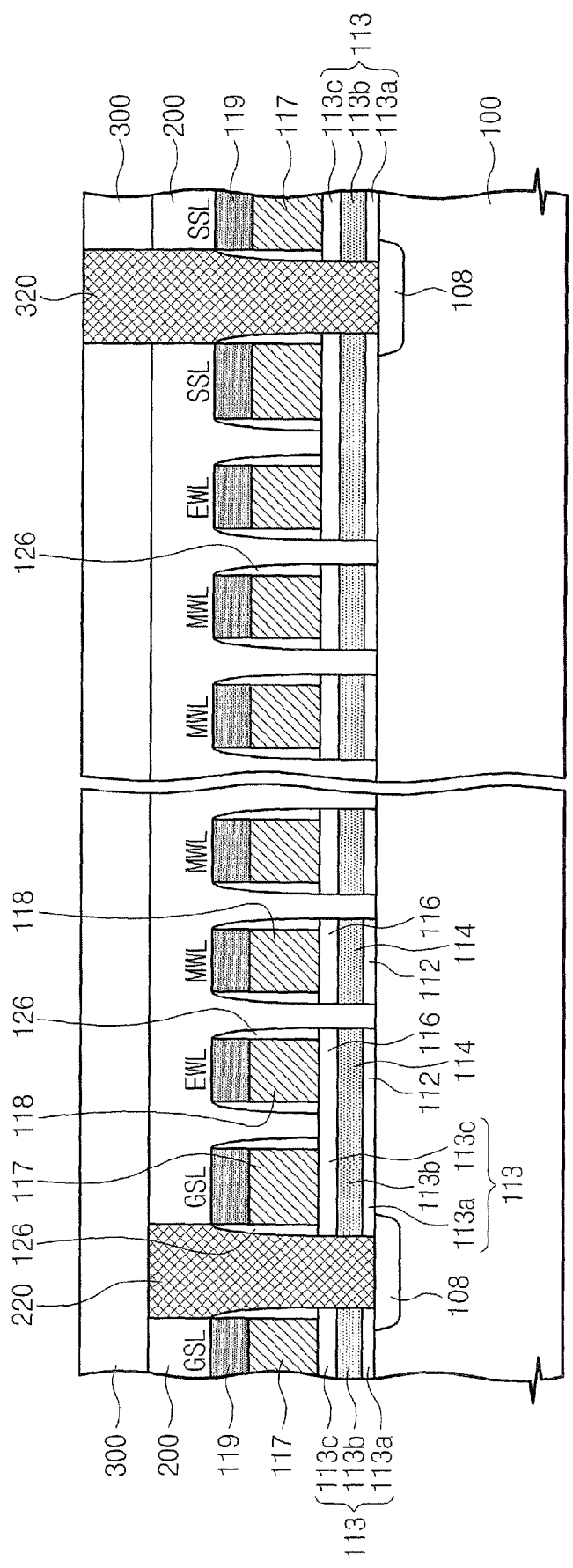

FIGS. 2 and 3 illustrate a detailed structure of a nonvolatile memory device according to some embodiments. Thus, for convenience, the description of common features is omitted below.

Referring to FIG. 2, a word line group is disposed on a semiconductor substrate 100 and includes edge word lines (EWL) and middle word lines (MWL) disposed between the edge word lines (EWL). One of the edge word lines (EWL) is disposed adjacent to a ground select line (GSL) and the other is disposed adjacent to a string select line (SSL). The middle word lines (MWL) and the edge word lines (EWL) may include a tunnel insulating pattern 112, a charge storage pattern 114, a blocking insulating pattern 116 and a gate electrode 118 that are disposed sequentially on the substrate 100.

The ground select line (GSL) and the string select line (SSL) may include an insulating layer 113 and a gate electrode 117 that are sequentially stacked. The insulating layer 113 may include a material layer 113b including the same material as the charge storage pattern 114. In addition, the insulating layer 113 may further include a lower layer 113a including the same material as the tunnel insulating pattern 112 and an upper layer 113c including the same material as the blocking insulating pattern 116. A capping pattern 119 may be deposited on top layers of the middle word lines (MWL), the edge word lines (EWL), the ground select line (GSL) and the string select line (SSL).

The charge storage patterns 114 of the middle word lines (MWL) and the edge word lines (EWL) are disposed to be separated from each other. The charge storage pattern 114 of the edge word line adjacent to the ground select line (GSL) extends on one side to be connected to the insulating layer 113 of the ground select line (GSL) (in particular, to the material layer 113b of the ground select line). That is, the charge storage pattern 114 extends between the edge word line (EWL) and the ground select line (GSL). Also, the charge storage pattern 114 of the edge word line (EWL) adjacent to the string select line (SSL) extends on one side to be connected to the insulating layer 113 of the string select line (SSL) (in particular, to the material layer 113b of the string select line).

In some embodiments, both side surfaces of the gate electrodes 118 of the middle word lines (MWL) may be coplanar with both side surfaces of their respective charge storage patterns 114. Also, a side surface of the charge storage pattern 114 of the edge word line (EWL) (e.g., the side surface that faces the middle word lines (MWL)) may be coplanar with a side surface of the gate electrode 118 of the edge word line (EWL).

A spacer 125 is provided to fill spaces between the middle word lines (MWL), between the middle word lines (MWL) and the edge word lines (EWL), between one edge word line (EWL) and the ground select line (GSL) and between the other edge word line (EWL) and the string select line (SSL). The spacer 125 may include, for example, a silicon oxide layer, a silicon oxynitride layer and/or a silicon nitride layer. The spacer 125 is also disposed on sides where the ground select lines (GSL) of neighboring word line groups face each other and on sides where the string select lines (SSL) of neighboring word line groups face each other. A source/drain electrode 108 is disposed in the semiconductor substrate 100 between the ground select lines (GSL) and the string select lines (SSL).

A first interlayer insulating layer 200 covering the word line group is disposed. A common source line (CSL) 220 in contact with the source/drain electrode 108 between ground select lines (GSL) of neighboring word line groups is disposed in the first interlayer insulating layer 200. A second interlayer insulating layer 300 is disposed on the first interlayer insulating layer 200. It will be appreciated that an interlayer insulating layer is an insulating layer that provides separation between vertically offset layers, such as vertically offset metallization layers of a device. A bit line contact 320 in contact with the source/drain electrode 108 between the string select lines (SSL) of neighboring word line groups is disposed in the first and second interlayer insulating layers 200 and 300.

FIG. 3 illustrates a device structure according to further embodiments. In the device structure of FIG. 3, spacers 126 are disposed on both sides of the gate electrodes 118 of the middle word lines (MWL) and on both sides of the gate electrodes 118 of the edge word lines (EWL). However, the spacers 126 do not completely fill the spaces between adjacent ones of the gate electrodes, nor do the spacers 126 extend onto side surfaces of the respective charge storage patterns 114 of the middle word lines (MWL) and the edge word lines (EWL). The charge storage patterns 114 of the middle word lines (MWL) and the edge word lines (EWL) may extend under the spacers 126 by a distance equal to the width of the bottom surfaces of the spacers 126. The first interlayer insulating layer 200 may fill spaces between adjacent ones of the middle word lines (MWL) and the edge word lines (EWL).

Figure 4:
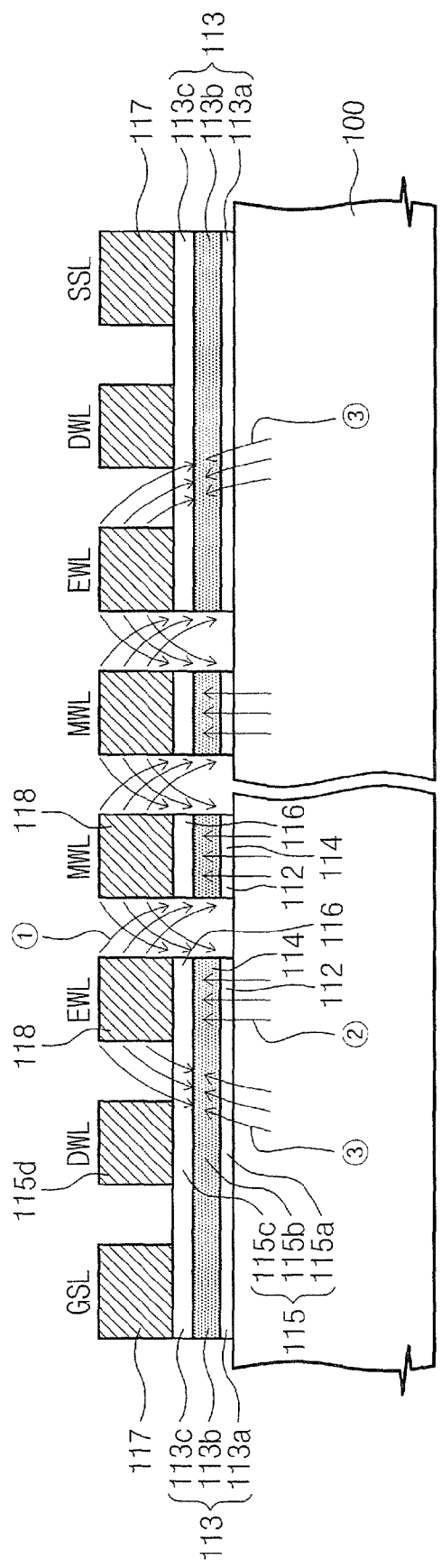
FIG. 4 is a cross sectional views that illustrates a nonvolatile memory device according to further embodiments.

FIG. 4 illustrates a nonvolatile memory device according to further embodiments. The embodiments illustrated in FIG. 4 are similar to the aforementioned embodiments, except that one or more dummy word lines are included in the structure. Like numbers refer to like elements in previous figures, the description of which is omitted below for brevity.

Referring to FIG. 4, a word line group is disposed on a semiconductor substrate 100. The word line group includes edge word lines (EWL) and middle word lines (MWL) disposed between the edge word lines (EWL). A peripheral line including an insulating layer is disposed on one side of the word line group (WL). According to some embodiments, the peripheral line may be a dummy word line (DWL). Unlike the word lines in the word line group, the dummy word line (DWL) may not be used to store data.

The ground select line (GSL) and the string select line (SSL) are disposed adjacent respective dummy word lines (DWL). A dummy word line (DWL) may be disposed between the ground select line (GSL) and the word line group and a dummy word line (DWL) may be disposed between the string select line (SSL) and the word line group. The middle word lines (MWL) and the edge word lines (EWL) include a tunnel insulating pattern 112, a charge storage pattern 114, a blocking insulating pattern 116 and a gate electrode 118 that are disposed on a semiconductor substrate 100. The dummy word line (DWL) may include an insulating layer 115 and a gate electrode 115*d* that are sequentially stacked. The insulating layer 115 may include a lower layer 115*a* including the same material as the tunnel insulating pattern 112, a material layer 115*b* including the same material as the charge storage pattern 114 and an upper layer 115*c* including the same material as the blocking insulating pattern 116.

In one aspect, the gate electrodes 115*d* of the dummy word lines (DWL) are formed on the insulating patterns of the edge word lines (EWL), including the charge storage patterns 114 thereof, and are spaced laterally apart from the gate electrodes 118 of the edge word lines (EWL).

The charge storage patterns 114 of the middle word lines (MWL) and the edge word lines (EWL) are separated from each other. The charge storage patterns 114 of the edge word lines (EWL) extend on one side to be connected to the insulating layer 115*s* of the adjacent dummy word lines (DWL) (in particular, to the material layer 115*b*). That is, an extended charge storage pattern 114 is disposed between the edge word lines (EWL) and the respective dummy word lines (DWL).

An erasing voltage may be applied to the word line group and the semiconductor substrate 100. For example, 0V may be applied to the word line group and a positive erasing voltage (e.g., 20V) may be applied to a well region of the semiconductor substrate 100. Charges are injected into the charge storage patterns 114 disposed just under the gate electrodes 118 of the word line group by applying the erasing voltage (as indicated by arrow ②). The distance between the word lines of the word line group may be narrow, and as a result, a fringing electric field of an adjacent word line group (WL) may affect the erasing speed.

An erasing electric field of the middle word lines (MWL) is strengthened by both fringing electric fields of adjacent word lines (arrow ①). Charges are stored in the extended charge storage pattern 114 between the edge word line (EWL) and the dummy word line (DWL) (as indicated by arrow ③) by an edge electric field (arrow ①) of the edge word line (EWL).

The charges stored in the extended charge storage pattern 114 can lower threshold voltages of the edge word lines (EWL). Channels can be easily formed in channel regions of the edge word lines (EWL) by the charges stored in the extended charge storage pattern 114. Also, an inversion layer acting as a source/drain can be easily formed in the semiconductor substrate 100 between the edge word line (EWL) and the dummy word line (DWL) by the charges stored in extended charge storage pattern 114. Thus, the channel of the dummy word line (DWL) and the inversion layer acting as a source/drain can balance with electrical characteristics of channels and sources/drains of the middle word lines (MWL).

FIGS. 5A through 5E illustrate methods of forming a nonvolatile memory device according to some embodiments of the present invention.

Figure 5A:
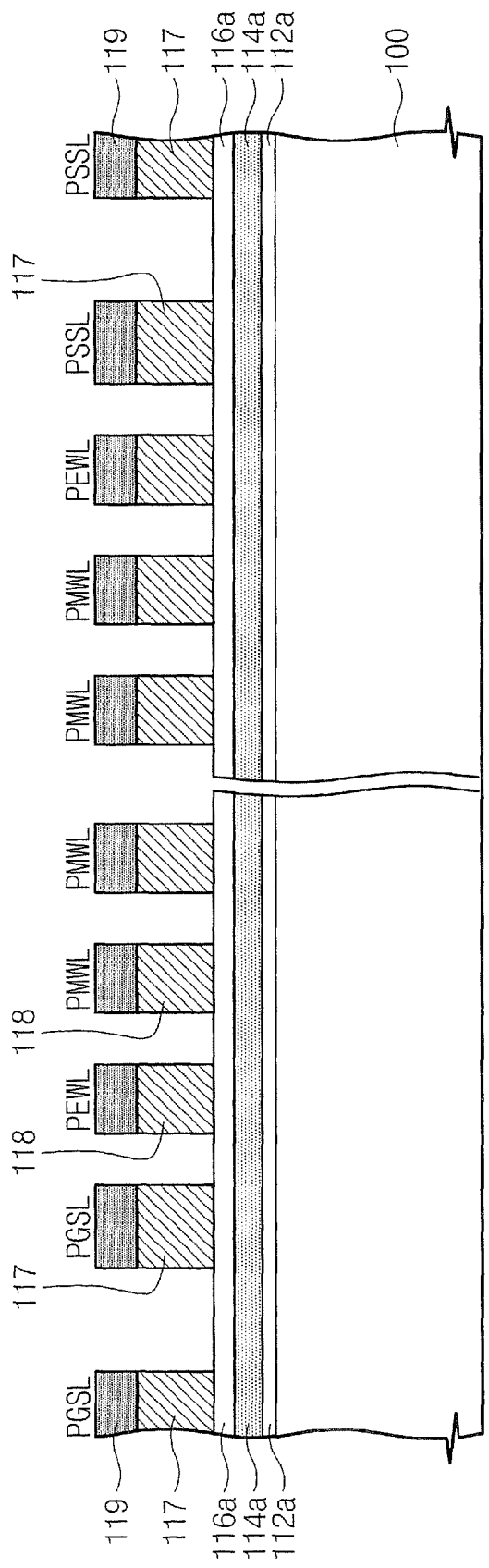
FIGS. 5a through 5e are cross sectional views that illustrate methods of forming a nonvolatile memory device according to some embodiments.

Referring to FIG. 5A, a tunnel insulating layer 112*a*, a charge storage layer 114*a* and a blocking insulating layer 116*a* are sequentially formed on a semiconductor substrate 100. The tunnel insulating layer 112*a* may include a silicon oxide layer and/or a silicon oxynitride layer. The tunnel insulating layer 112*a* may be formed by a thermal oxidation process. The charge storage layer 114*a* may include a silicon nitride layer, a zirconium oxide layer (ZrO), a tantalum oxide layer (TaO), a hafnium silicon oxide layer (HfSiO), a hafnium oxynitride layer (HfON), a zirconium oxynitride layer (ZrON), a hafnium silicon oxynitride layer (HfSiON) and/or a hafnium aluminum oxynitride layer (HfAlON).

The blocking insulating layer 116*a* may be formed of a high dielectric layer having a dielectric constant greater than the tunnel insulating layer 112*a*. For example, the blocking insulating layer 116*a* may be formed of an insulating metal oxide layer, such as an aluminum oxide layer, a lanthanum hafnium oxide layer (LaHfO), a lanthanum aluminum oxide layer (LaAlO) and/or a dysprosium scandium oxide layer (DyScO).

Preliminary edge word lines (PEWL), preliminary middle word lines (PMWL) disposed between the preliminary edge word lines (PEWL), a preliminary ground select line (PGSL) and a preliminary string select line (PSSL) are formed on the semiconductor substrate 100. The preliminary edge word lines (PEWL), the preliminary middle word lines (PMWL), the preliminary ground select line (PGSL) and the preliminary string select line (PSSL) may include a gate electrode (117, 118) and a capping pattern 119 that are sequentially stacked.

The gate electrode (117, 118) may include a conductive material having a work function of more than 4 eV. For example, the gate electrodes 118 may include doped polysilicon, Ti, TiN, TaN, TaTi, TaSiN, Ta, W, Hf, HUN, Nb, Mo, $RuO_2$, RuO, $Mo_2N$, WN, WSi, NiSi, $Ti_3Al$, $Ti_2AlN$, Pd, Ir, Pt, Co, Cr, CoSi, NiSi and/or AlSi. The capping patterns 119 may be formed of a silicon nitride layer.

Figure 5B:
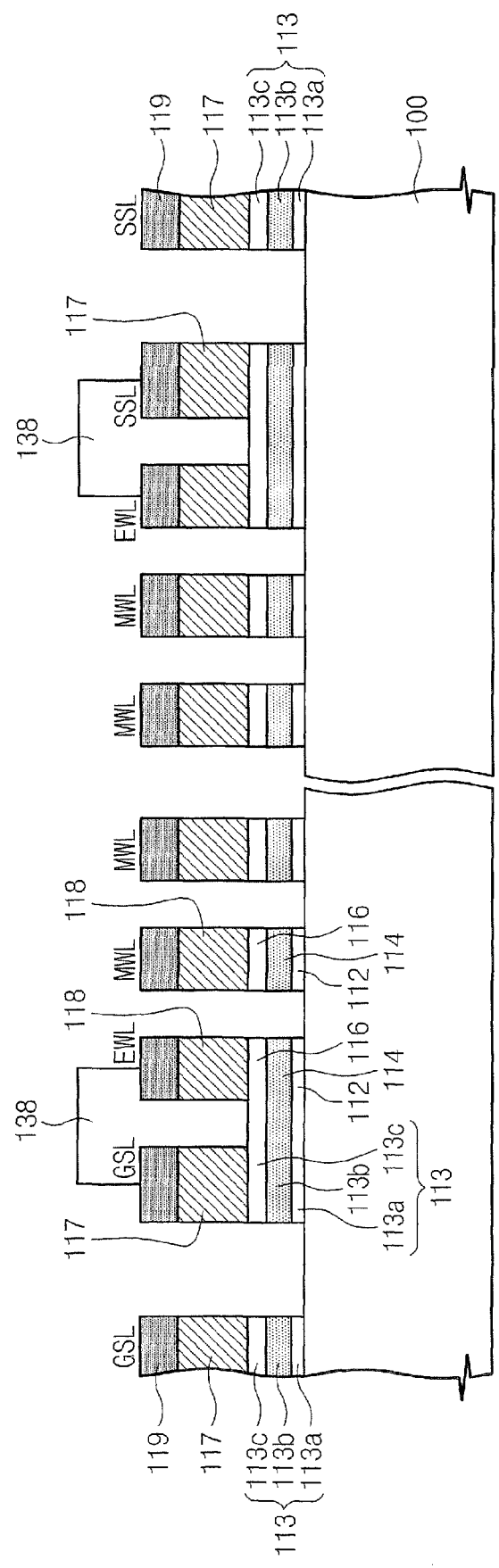

Referring to FIG. 5B, an etching mask 138 covering a space between one of the preliminary edge word lines (PEWL) and the preliminary ground select line (PGSL) and a space between one of the preliminary edge word lines (PEWL) and the preliminary string select line (PSSL) is formed. The etching mask 138 may be a photoresist pattern. An etching process is performed using the etching mask 138, the preliminary edge word lines (PEWL), the preliminary middle word lines (PMWL), the preliminary ground select line (PGSL) and the preliminary string select line (PSSL) as an etch mask. Thus, middle word lines (MWL) and edge word lines (EWL) having respective tunnel insulating patterns 112, charge storage patterns 114 and blocking insulating patterns 116 are formed. The middle word lines (MWL) and the edge word lines (EWL) may constitute a word line group.

At the same time, a ground select line (GSL) and a string select line (SSL) including an insulating layer 113 are formed. The insulating layer 113 may include a lower layer 113a including the same material as the tunnel insulating pattern 112, a material layer 113b including the same material as the charge storage pattern 114 and an upper layer 113c including the same material as the blocking insulating pattern 116.

The charge storage pattern 114 of one of the edge word lines (EWL) extends on one side to be connected to the insulating layer 113 of the ground select line (GSL) (in particular, to the material layer 113b). Also, the charge storage pattern 114 of the other edge word line (EWL) extends on one side to be connected to the insulating layer 113 of the string select line (SSL) (in particular, to the material layer 113b). Accordingly, an extended charge storage pattern 114 is disposed between an edge word line (EWL) and the ground select line (GSL) and between an edge word line (EWL) and the string select line (SSL).

Both sides of the gate electrodes 118 of the middle word lines (MWL) may be coplanar with both sides of their respective charge storage patterns 114. Also, sides of the charge storage patterns 114 of the edge word lines (EWL) facing the middle word lines (MWL) may be coplanar with sides of the respective gate electrodes 118 of the edge word lines (EWL).

Figure 5C:
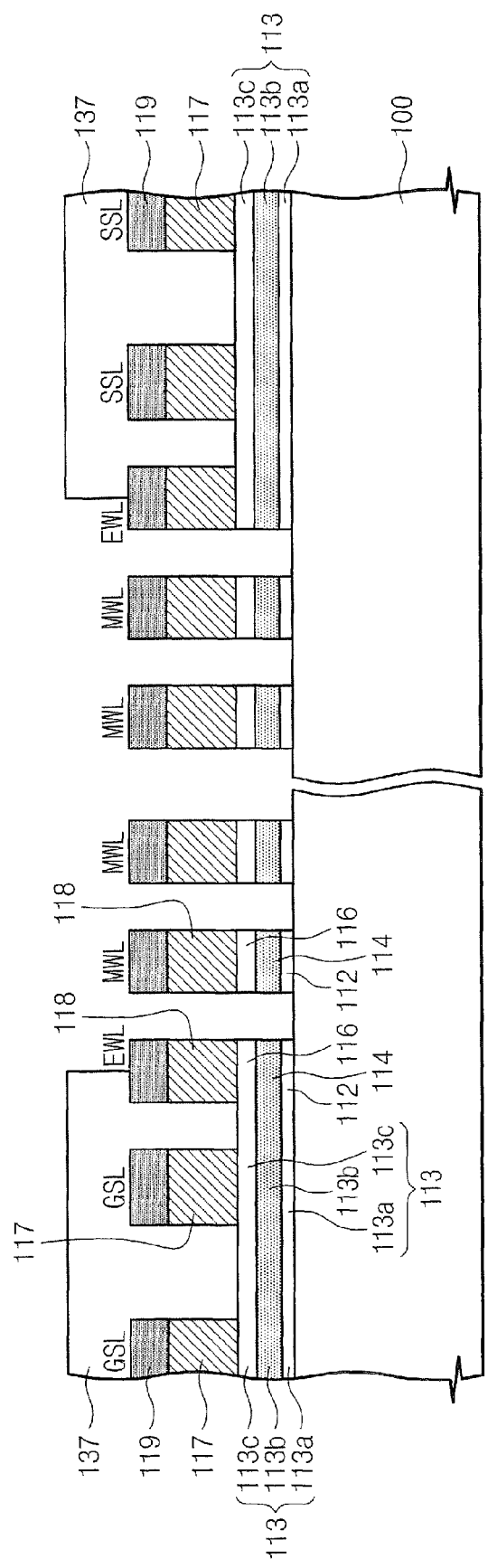

Referring to FIG. 5C, unlike FIG. 5B, an etching mask 137 is also disposed between the preliminary string select lines (PSSL) and between the preliminary ground select lines (PGSL) of neighboring word line groups. Thus, the insulating layers 113 may be formed to be connected to each other between the preliminary string select lines (PSSL) and between the preliminary ground select lines (PGSL) of neighboring word line groups.

Figure 5D:
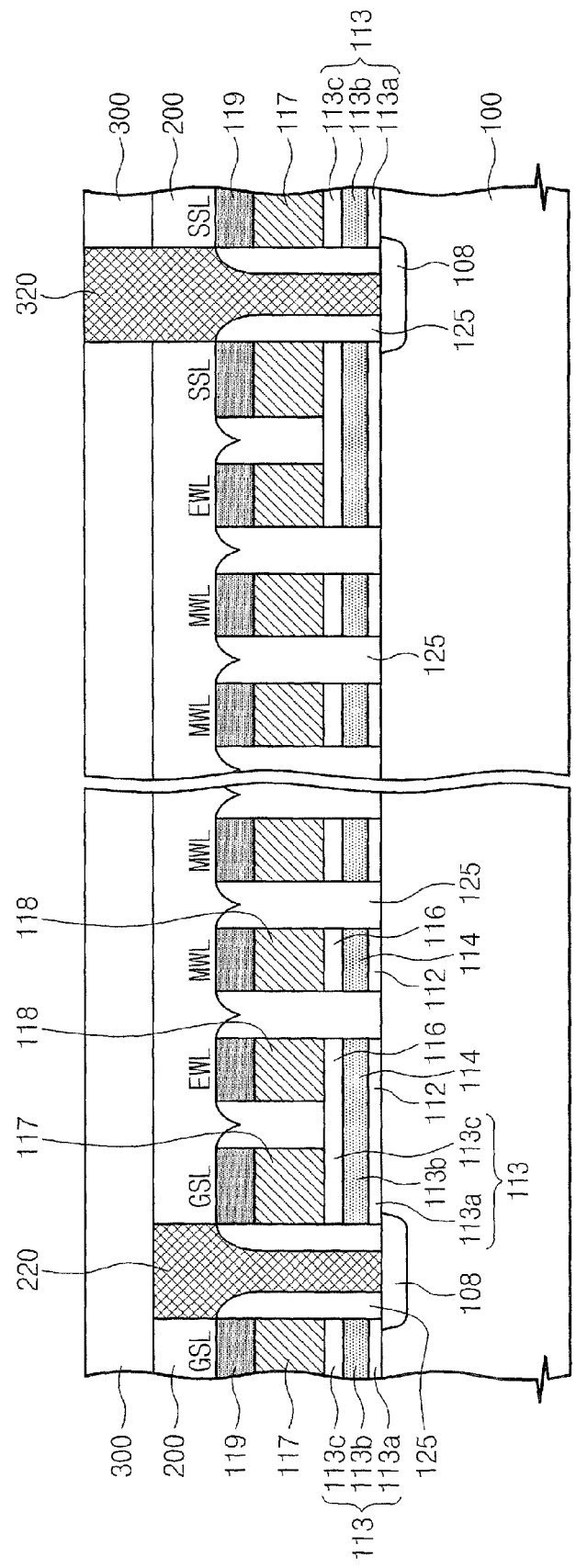

Referring to FIG. 5D, spacers 125 filling spaces between the middle word lines (MWL), between the middle word lines (MWL) and the edge word lines (EWL), between the edge word line (EWL) and the ground select line (GSL) and between the edge word line (EWL) and the string select line (SSL) are formed. An insulating layer is formed, and then an anisotropic etching process is performed on the insulating layer to form the spacers 125. The spacers 125 may include a silicon oxide layer, a silicon oxynitride layer and/or a silicon nitride layer. The spacer 125 is formed on sides where the ground select lines (GSL) of neighboring word line groups are facing each other and on sides where the string select lines (SSL) of neighboring word line groups are facing each other.

A source/drain electrode 108 is formed in the semiconductor substrate 100 between the string select lines (SSL) and between the ground select lines (GSL). The source/drain electrode 108 may be formed by performing an ion implantation process. A first interlayer insulating layer 200 covering the word line group is formed. A common source line (CSL) 220 in contact with the source/drain electrode 108 is formed in the first interlayer insulating layer 200. A second interlayer insulating layer 300 is formed on the first interlayer insulating layer 200. A bit line contact 320 in contact with the source/drain electrode 108 between the string select lines (SSL) is disposed in the first and second interlayer insulating layers 200 and 300.

Figure 5E:
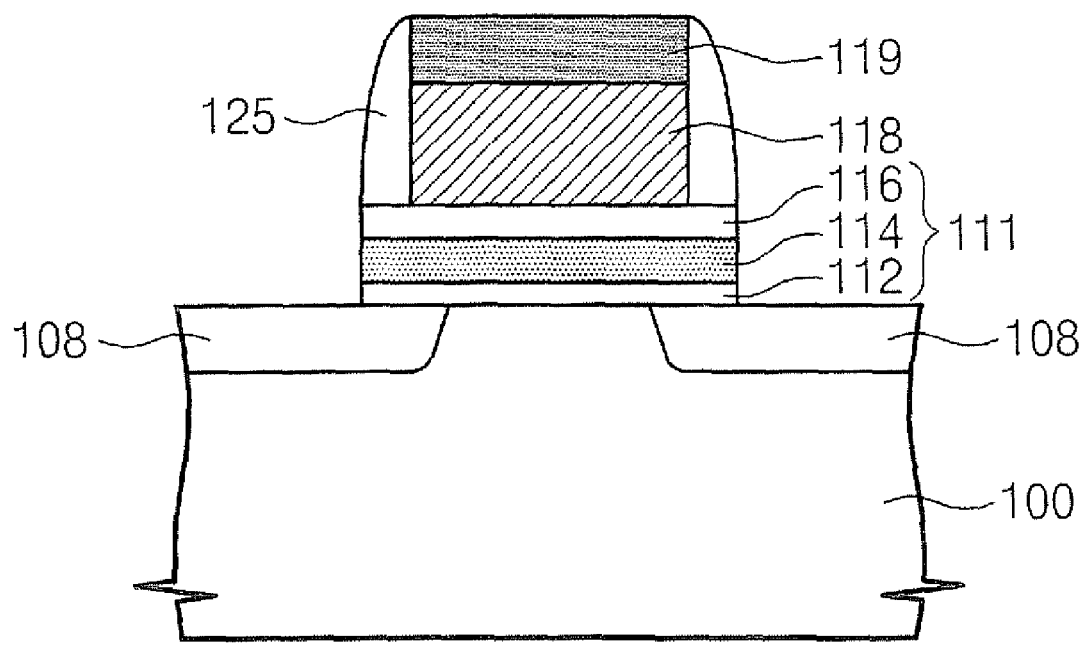

FIG. 5E illustrates a transistor of a peripheral region. The transistor of a peripheral region includes an insulating layer 111 and the gate electrode 118. The insulating layer 111 may include the tunnel insulating pattern 112, the charge storage pattern 114 and the blocking insulating pattern 116. A capping pattern 119 may be formed on the gate electrode 118 and the spacer 125 may be formed on both sides of the gate electrode 118. That is, the insulating layer 111 may be formed after the spacer 125 is formed. A source/drain electrode 108 is formed in the semiconductor substrate 100 adjacent to both sides of the gate electrode 118. The source/drain electrode 108 may be simultaneously formed when the source/drain electrode 108 is formed between the ground select lines (GSL) and between the string select lines (SSL).

FIGS. 6A through 6D illustrate methods of forming a nonvolatile memory device according to further embodiments of the present invention. The embodiments illustrated in FIGS. 6A through 6D are similar to the aforementioned embodiments, except that one or more dummy word lines are included. Thus, the description of common features is omitted below for brevity.

Figure 6A:
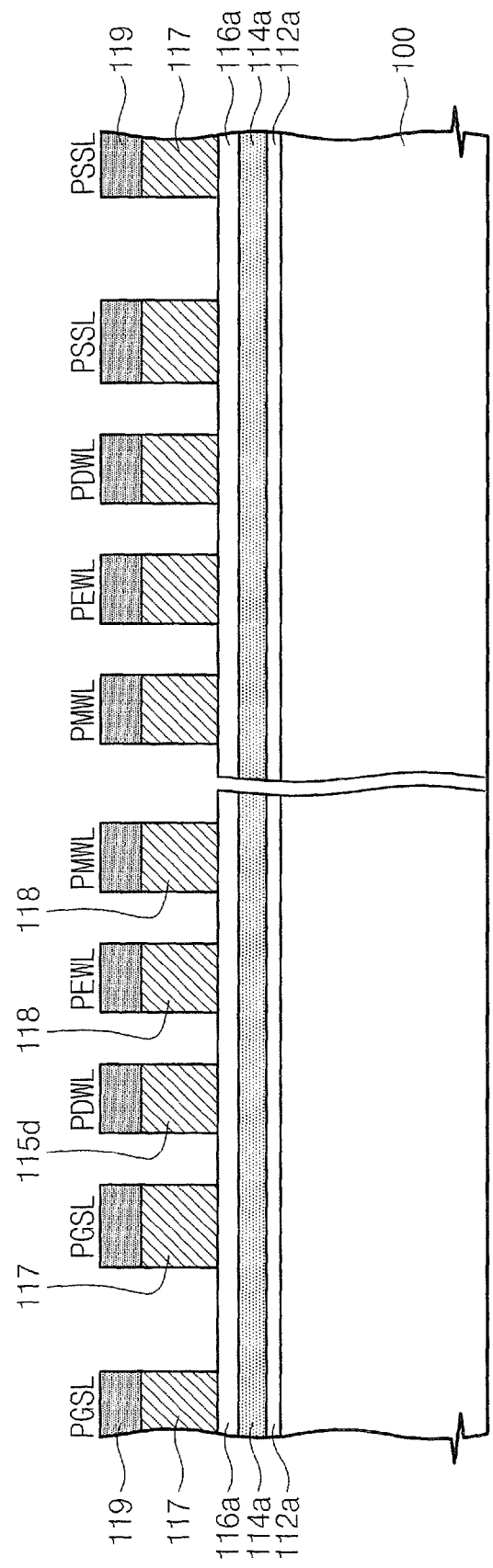
FIGS. 6a through 6d are cross sectional views that illustrate methods of forming a nonvolatile memory device according to further embodiments.

Referring to FIG. 6A, a tunnel insulating layer 112a, a charge storage layer 114a and a blocking insulating layer 116a are sequentially formed on the semiconductor substrate 100. The tunnel insulating layer 112a may include a silicon oxide layer and/or a silicon oxynitride layer. The tunnel insulating layer 112a may be formed by a thermal oxidation process. The charge storage layer 114a may include a silicon nitride layer, a zirconium oxide layer (ZrO), a tantalum oxide layer (TaO), a hafnium silicon oxide layer (HfSiO), a hafnium oxynitride layer (HfON), a zirconium oxynitride layer (ZrON), a hafnium silicon oxynitride layer (HfSiON) and/or a hafnium aluminum oxynitride layer (HfAlON).

The blocking insulating layer 116a may be formed of a high dielectric layer having a dielectric constant greater than the tunnel insulating layer 112a. For example, the blocking insulating layer 116a may be formed of an insulating metal oxide layer. A preliminary dummy word line (PDWL), preliminary edge word lines (PEWL), preliminary middle word lines (PMWL) disposed between the preliminary edge word lines (PEWL), a preliminary ground select line (PGSL) and a preliminary string select line (PSSL) are formed on the semiconductor substrate 100. The preliminary dummy word line (PDWL), the preliminary edge word lines (PEWL), the preliminary middle word lines (PMWL), the preliminary ground select line (PGSL) and the preliminary string select line (PSSL) may be formed of a gate electrode (115d, 117, 118) and a capping pattern 119 that are sequentially stacked. The gate electrodes 118 may be formed of conductive material having a work function of more than 4 eV. The capping patterns 119 may be formed of a silicon nitride layer.

Figure 6B:
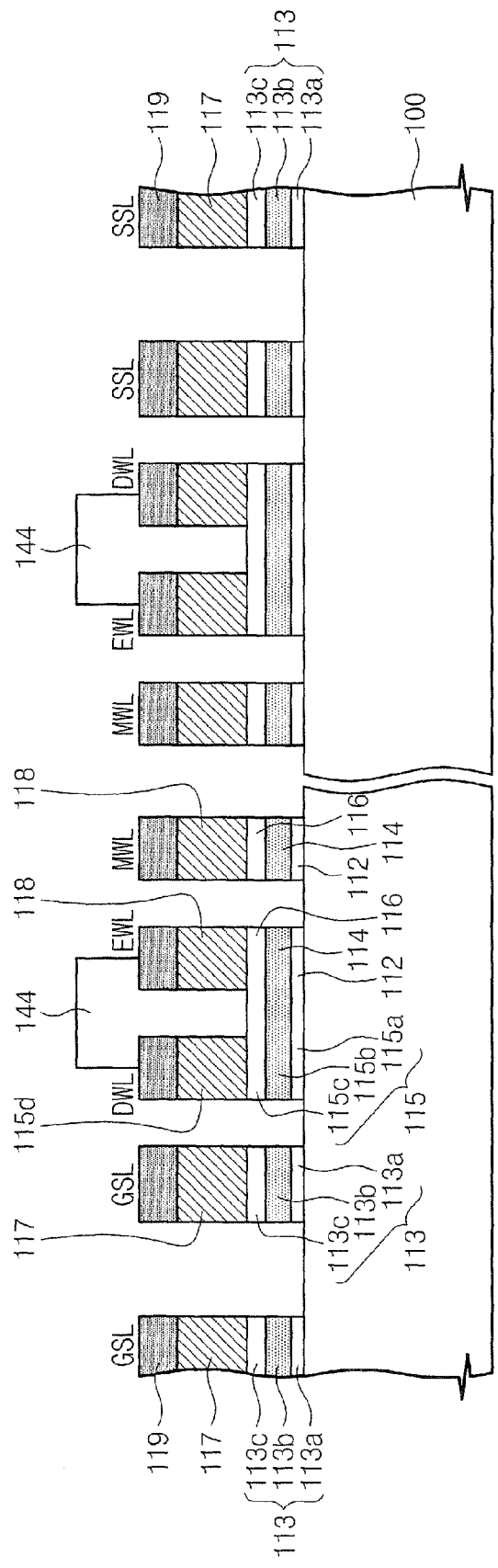

Referring to FIG. 6B, an etching mask 144 covering the charge storage layer 114a between the preliminary edge word line (PEWL) and the preliminary dummy word line (PDWL) and the charge storage layer 114a between the preliminary edge word line (PEWL) and the preliminary dummy word line (PDWL) is formed. The etching mask 144 may be a photoresist pattern. An etching process is performed using the etching mask 144, the preliminary dummy word line (PDWL), the preliminary edge word lines (PEWL), the preliminary middle word lines (PMWL), the preliminary ground select line (PGSL) and the preliminary string select line (PSSL) as an mask. Thus, middle word lines (MWL) and edge word lines (EWL) having respective tunnel insulating patterns 112, charge storage patterns 114 and blocking insulating patterns 116 are formed. The middle word lines (MWL) and the edge word lines (EWL) may constitute a word line group.

One or more dummy word lines (DWL), a ground select line (GSL) and a string select line (SSL) are also formed at the same time. The insulating layer 115 may include a lower layer 115a including the same material as the tunnel insulating pattern 112, a material layer 115b including the same material as the charge storage pattern 114 and an upper layer 115c including the same material as the blocking insulating pattern 116. Also, the ground select line (GSL) and the string select line (SSL) include an insulating layer 113. The insulating layer 113 may include a lower layer 113a including the same material as the tunnel insulating pattern 112, a material layer 113b including the same material as the charge storage pattern 114 and an upper layer 113c including the same material as the blocking insulating pattern 116.

The charge storage patterns 114 of the edge word lines (EWL) extend on one side to be connected to the insulating layers 115 of respective ones of the dummy word lines (DWL) (in particular, to the material layers 115b). Thus, extended charge storage patterns 114 are disposed between the edge word lines (EWL) and the respective dummy word lines (DWL).

Both side surfaces of the gate electrodes 118 of the middle word lines (MWL) may be coplanar with both side surfaces of their respective charge storage patterns 114. Also, side surfaces of the charge storage patterns 114 of the edge word lines (EWL) facing the middle word lines (MWL) may be coplanar with respective side surfaces of the gate electrodes 118 of the edge word lines (EWL).

Figure 6C:
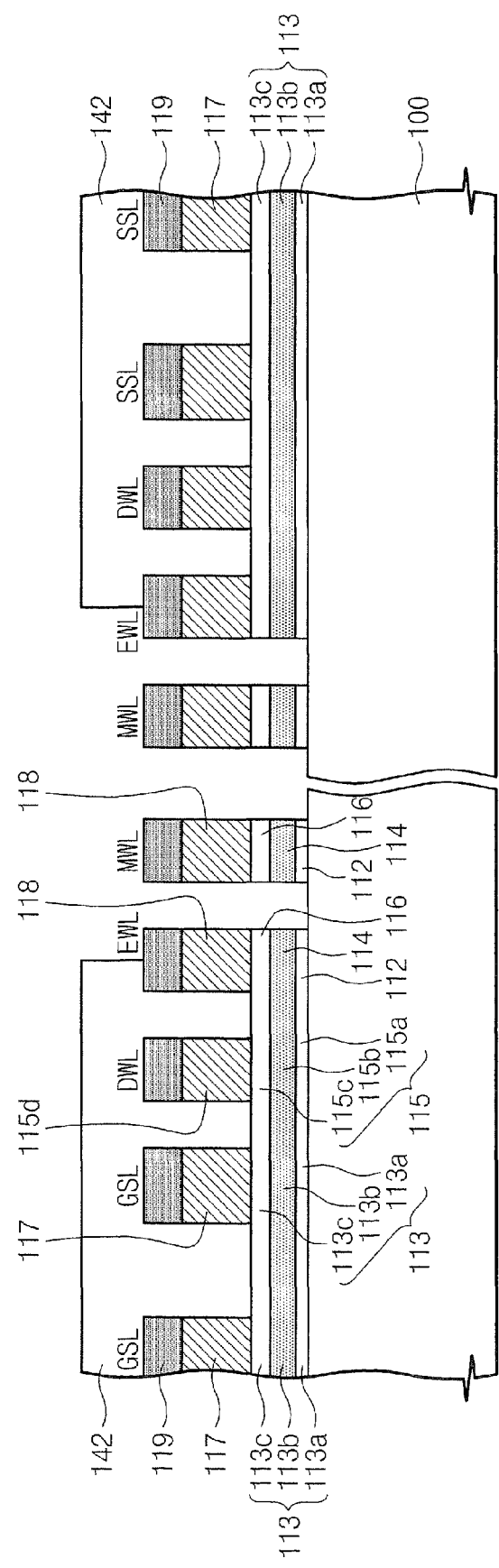

Referring to FIG. 6C, unlike FIG. 6B, the etching mask 142 is also disposed between the preliminary string select lines (PSSL) of neighboring word line groups and between the preliminary ground select lines (PGSL) of neighboring word line groups. Thus, the insulating layers 113 of the ground select lines (GSL) may be connected to each other as well as to the insulating layers 113 of the respective dummy word lines (DWL) and the charge storage patterns 114 of the adjacent edge word lines (EWL). Similarly, the insulating layers 113 of the string select lines (SGSL) may be connected to each other as well as to the insulating layers 113 of the respective dummy word lines (DWL) and the charge storage patterns 114 of the adjacent edge word lines (EWL).

Figure 6D:
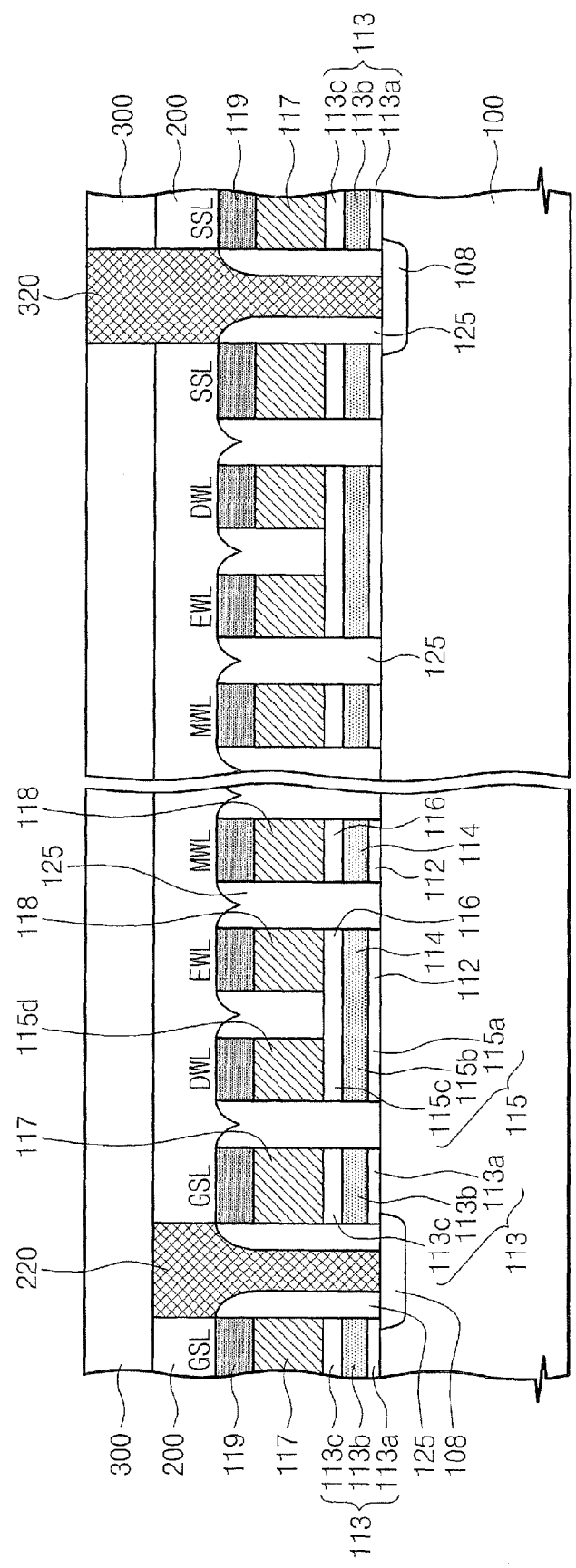

Referring to FIG. 6D, a spacer 125 is provided that fills spaces between the middle word lines (MWL), between the middle word lines (MWL) and the edge word lines (EWL), between the edge word lines (EWL) and the dummy word lines (DWL), between one of the dummy word lines (DWL) and the ground select line (GSL) and between the other dummy word line (DWL) and the string select line (SSL). An insulating layer is formed, and then an anisotropic etching process is performed on the insulating layer to form the spacer 125. The spacer 125 may include a silicon oxide layer, a silicon oxynitride layer and/or a silicon nitride layer. The spacer 125 may additionally be formed on side surfaces of the ground select lines (GSL) where the ground select lines (GSL) are facing each other and on side surfaces of the string select lines (SSL) where the string select lines (SSL) are facing each other.

A source/drain electrode 108 is formed in the semiconductor substrate 100 between the string select lines (SSL) and between the ground select lines (GSL). The source/drain electrode 108 may be formed by performing an ion implantation process. A first interlayer insulating layer 200 covering the word line group is formed. A common source line (CSL) 220 in contact with the source/drain electrode 108 is formed in the first interlayer insulating layer 200. A second interlayer insulating layer 300 is formed on the first interlayer insulating layer 200. A bit line contact 320 in contact with the source/drain electrode 108 between the string select lines (SSL) is disposed in the first and second interlayer insulating layers 200 and 300.

FIGS. 7A through 7F illustrate methods of forming a non-volatile memory device according to further embodiments. Although dummy lines are not explicitly shown in FIGS. 7A through 7F, such features could be included in these embodiments using the techniques described above for the formation of dummy word lines.

Figure 7A:
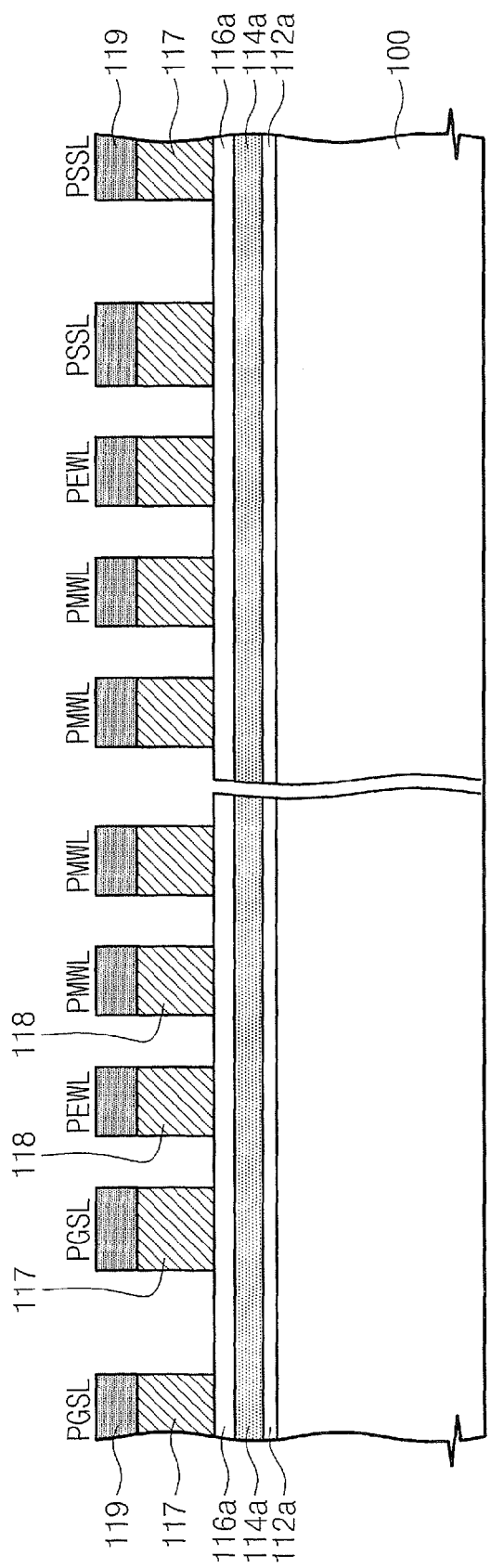
FIGS. 7a through 7f are cross sectional views that illustrate methods of forming a nonvolatile memory device according to further embodiments.

Referring to FIG. 7A, a tunnel insulating layer 112a, a charge storage layer 114a and a blocking insulating layer 116a are sequentially formed on a semiconductor substrate 100. The tunnel insulating layer 112a may include a silicon oxide layer and/or a silicon oxynitride layer. The tunnel insulating layer 112a may be formed by a thermal oxidation process. The charge storage layer 114a may include a silicon nitride layer, a zirconium oxide layer (ZrO), a tantalum oxide layer (TaO), a hafnium silicon oxide layer (HfSiO), a hafnium oxynitride layer (HfON), a zirconium oxynitride layer (ZrON), a hafnium silicon oxynitride layer (HfSiON) and/or a hafnium aluminum oxynitride layer (HfAlON).

The blocking insulating layer 116a may be formed of a high dielectric layer having a dielectric constant greater than the tunnel insulating layer 112a. For example, the blocking insulating layer 116a may be formed of an insulating metal oxide layer, such as an aluminum oxide layer. Additionally or alternatively, the blocking insulating layer 116a may be formed of a lanthanum hafnium oxide layer (LaHfO), a lanthanum aluminum oxide layer (LaAlO) and/or a dysprosium scandium oxide layer (DyScO).

Preliminary edge word lines (PEWL), preliminary middle word lines (PMWL) disposed between the preliminary edge word lines (PEWL), a preliminary ground select line (PGSL) and a preliminary string select line (PSSL) are formed on the semiconductor substrate 100. The preliminary edge word lines (PEWL), the preliminary middle word lines (PMWL), the preliminary ground select line (PGSL) and the preliminary string select line (PSSL) may include a gate electrode (117, 118) and a capping pattern 119 that are sequentially stacked.

The gate electrode 118 may include a conductive material having a work function of more than 4 eV. For example, the gate electrode 118 may include doped polysilicon, Ti, TiN, TaN, TaTi, TaSiN, Ta, W, Hf, HfN, Nb, Mo, RuO$_2$, RuO, Mo$_2$N, WN, WSi, NiSi, Ti$_3$Al, Ti$_2$AlN, Pd, Ir, Pt, Co, Cr, CoSi, NiSi and/or AlSi. The capping pattern 119 may be include a silicon nitride layer.

Figure 7B:
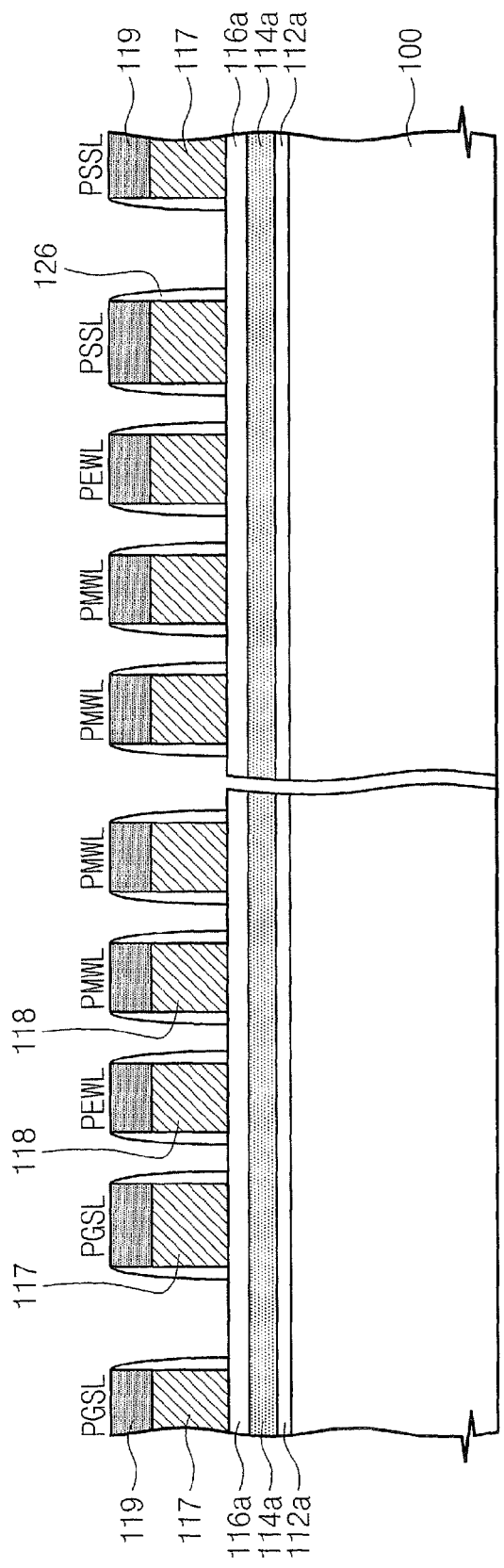

Referring to FIG. 7B, spacers 126 are formed on both sides of the gate electrodes 118 of the preliminary edge word lines (PEWL), the preliminary middle word lines (PMWL), the preliminary ground select line (PGSL) and the preliminary string select line (PSSL). The spacers 126 may be formed by depositing an insulating material, and then performing an anisotropic etching process. The spacers 126 may not completely fill spaces between adjacent ones of the preliminary edge word lines (PEWL), the preliminary middle word lines (PMWL), the preliminary ground select line (PGSL) and the preliminary string select line (PSSL), so that surfaces of the blocking insulating layer 116a between adjacent ones of the preliminary edge word lines (PEWL), the preliminary middle word lines (PMWL), the preliminary ground select line (PGSL) and the preliminary string select line (PSSL) may be exposed.

Figure 7C:
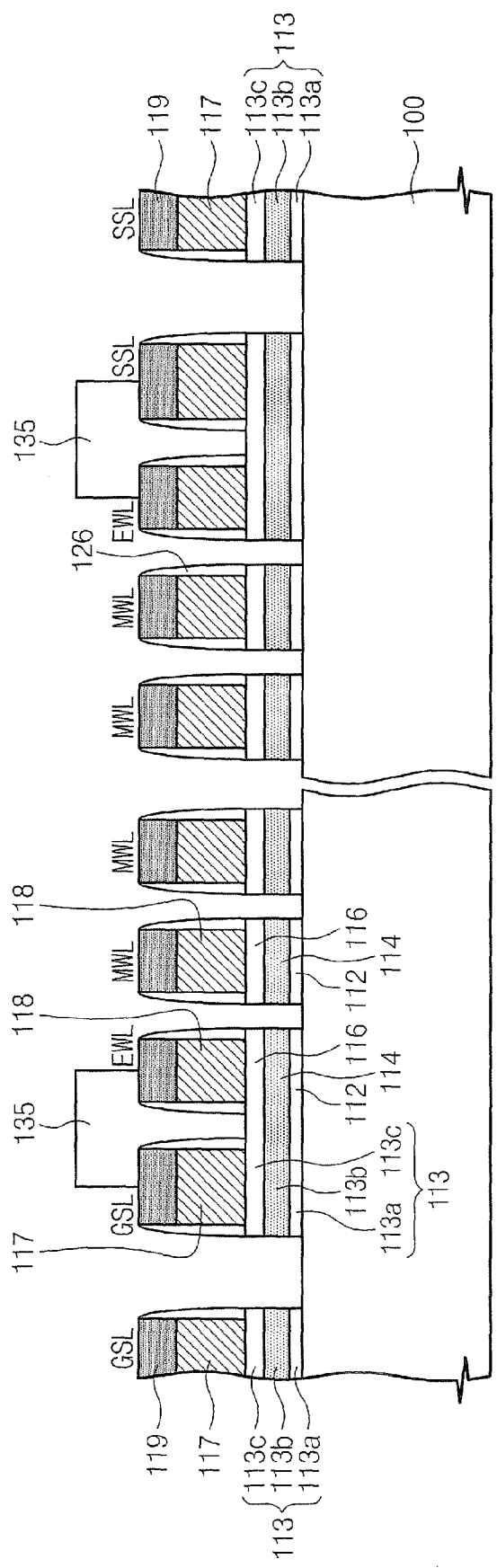

Referring to FIG. 7C, an etching mask 135 covering a space between one of the preliminary edge word lines (PEWL) and the preliminary ground select line (PGSL) and a space between the other preliminary edge word line (PEWL) and the preliminary string select line (PSSL) is formed. The etching mask 135 may be a photoresist pattern. An etching process is performed using the etching mask 135, the preliminary edge word lines (PEWL), the preliminary middle word lines (PMWL), the preliminary ground select line (PGSL) and the preliminary string select line (PSSL) as an mask. Thus, middle word lines (MWL) and edge word lines (EWL) having respective tunnel insulating patterns 112, charge storage patterns 114 and blocking insulating patterns 116 are formed. Also, a ground select line (GSL) and a string select line (SSL) are formed as described above. The middle word lines (MWL) and the edge word lines (EWL) may constitute a word line group.

The charge storage pattern 114 of one of the edge word lines (EWL) extends on one side to be connected to the insulating layer 113 of the ground select line (GSL) (in particular, to the material layer 113b). Also, the charge storage pattern 114 of the other edge word line (EWL) extends on one side to be connected to the insulating layer 113 of the string select line (SSL) (in particular, to the material layer 113b). Accordingly, an extended charge storage pattern 114 is disposed between one edge word line (EWL) and the ground select line (GSL) and between the other edge word line (EWL) and the string select line (SSL).

The charge storage patterns 114 of the middle word lines (MWL) can extend laterally away from side surfaces of the gate electrodes by a distance equal to the width of a bottom surface of the spacer 126. This is because the spacer 126 is used as an etch mask during an etching process. Also, the charge storage patterns 114 of the edge word lines (EWL) can extend laterally from side surfaces of the gate electrodes, on a side of the edge word line (EWL) facing the middle word lines (MWL), by a width of a bottom surface of the spacer 126. Accordingly, widths of the respective gate electrodes 118 of the edge word lines (EWL) and the middle word lines (MWL) may be smaller than widths of their corresponding charge storage patterns 114. The spacer 126 is used as a mask for forming the charge storage patterns 114. As a result, a proportional amount of the charge storage patterns 114 that are damaged during an etching process can be reduced.

Figure 7D:
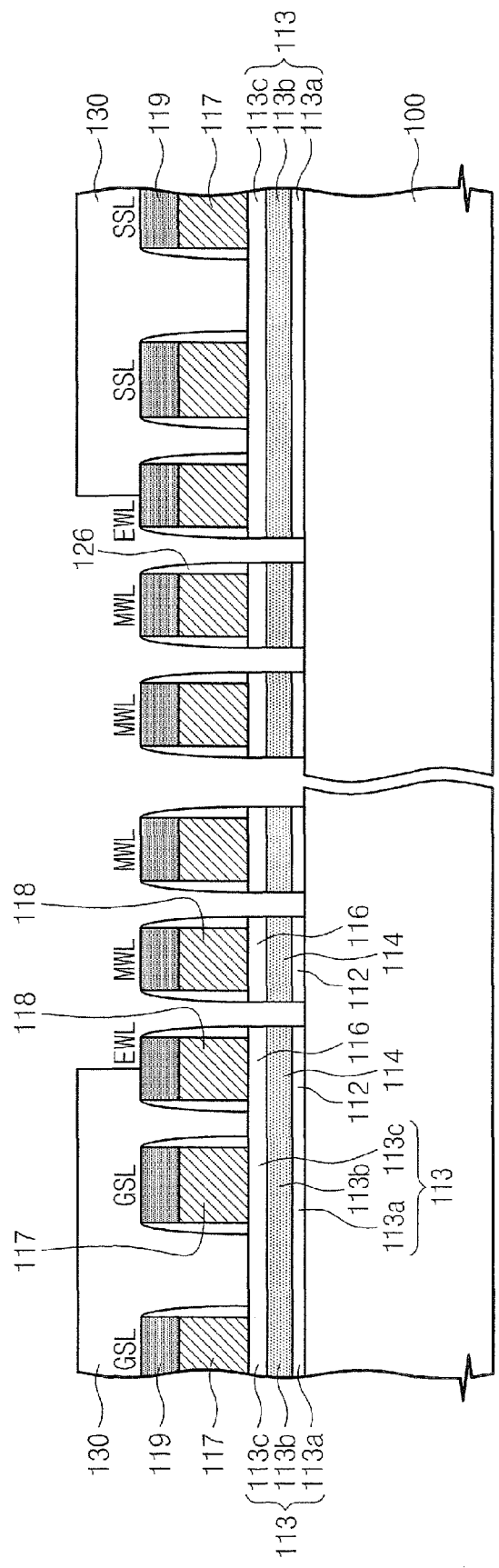

Referring to FIG. 7D, in some embodiments, unlike those of FIG. 7C, an etching mask 130 is also disposed between the preliminary string select lines (PSSL) and between the preliminary ground select lines (PGSL). Thus, the insulating layer 113 may extend between the preliminary string select lines (PSSL) of adjacent word line groups and between the preliminary ground select lines (PGSL) of adjacent word line groups.

Figure 7E:
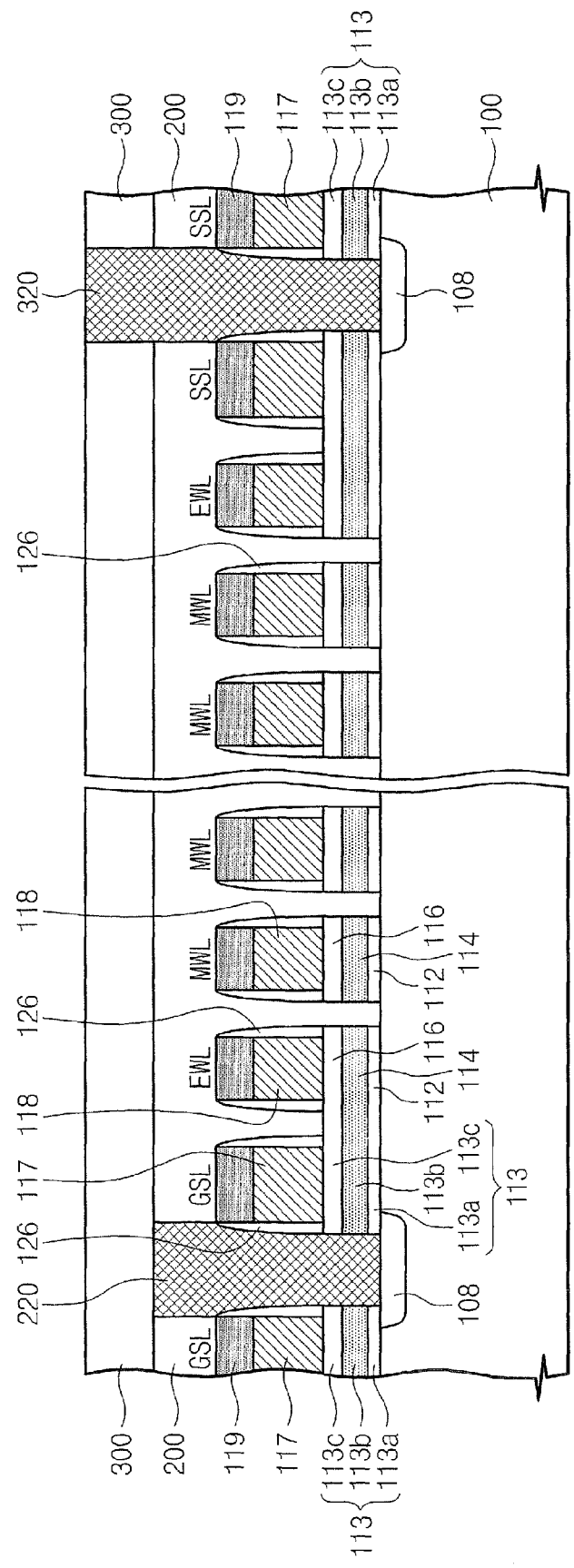

Referring to FIG. 7E, a first interlayer insulating layer 200 covering the word lines (MWL, EWL), the ground select line (GSL) and the string select line (SSL) is formed. A source/drain electrode 108 is disposed in the semiconductor substrate 100 between the ground select lines (GSL) and the string select lines (SSL). The source/drain electrode 108 may be formed by performing an ion implantation process. A common source line (CSL) 220 in contact with the source/drain electrode 108 is formed in the first interlayer insulating layer 200. A second interlayer insulating layer 300 is formed on the first interlayer insulating layer 200. A bit line contact 320 in contact with the source/drain electrode 108 between the string select lines (SSL) is disposed in the first and second interlayer insulating layers 200 and 300.

Figure 7F:
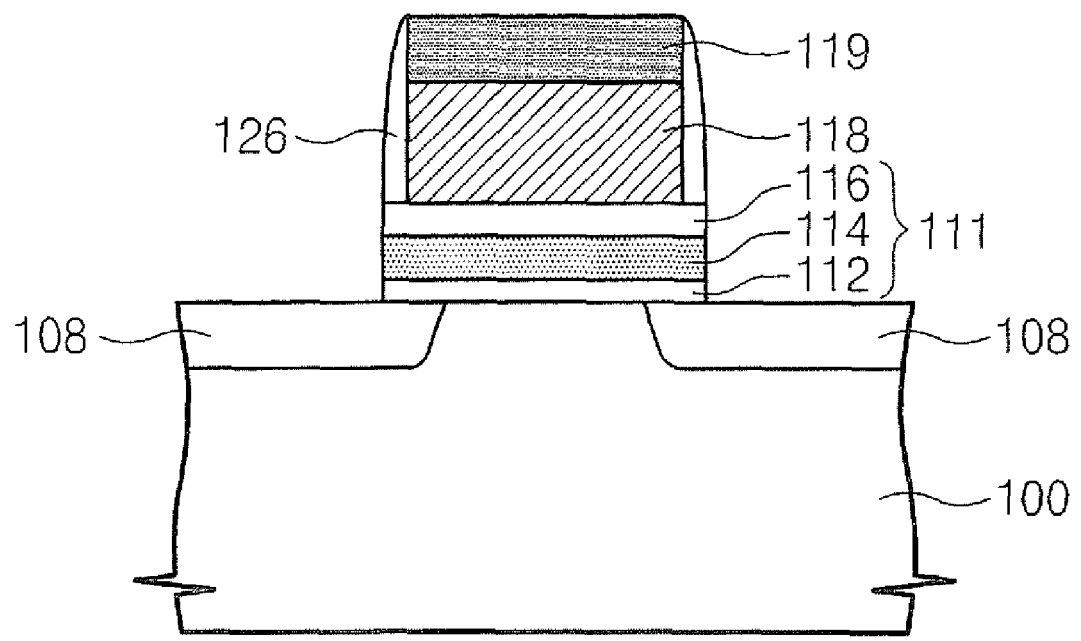

FIG. 7F illustrates a transistor of a peripheral region according to some embodiments. The transistor of a peripheral region includes an insulating layer 111 and the gate electrode 118. The insulating layer 111 may include the tunnel insulating pattern 112, the charge storage pattern 114 and the blocking insulating pattern 116. A capping pattern 119 may be formed on the gate electrode 118 and the spacer 126 may be formed on both sides of the gate electrode 118. That is, the tunnel insulating pattern 112, the charge storage pattern 114 and the blocking insulating pattern 116 may be formed after the spacer 126 is formed. A source/drain electrode 108 is formed in the semiconductor substrate 100 adjacent to both sides of the gate electrode 118. The source/drain electrode 108 may be simultaneously formed when the source/drain electrode 108 is formed between the ground select lines (GSL) and between the string select lines (SSL).

Figure 8:
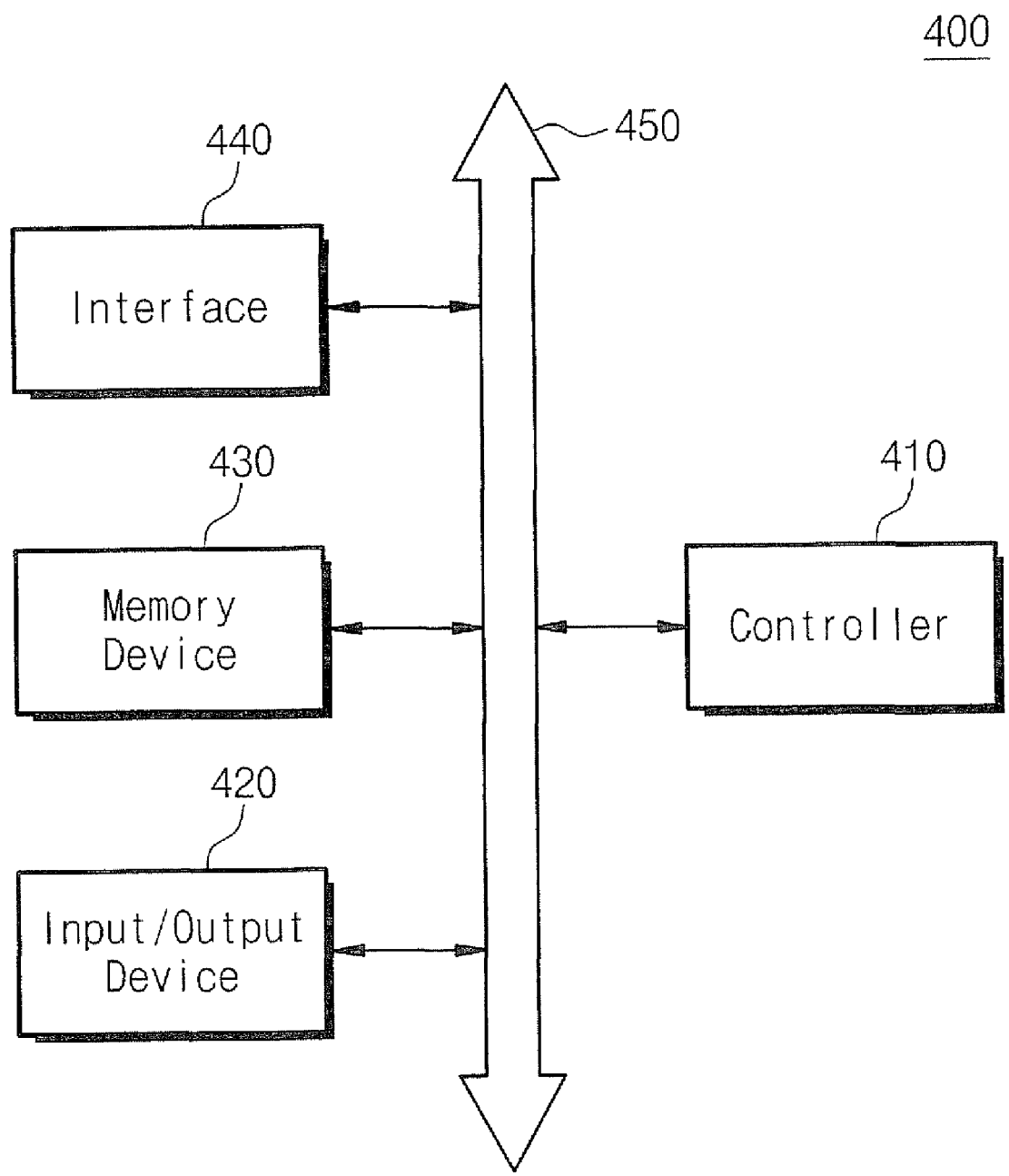
FIG. 8 is a block diagram of an electronic system including a nonvolatile memory device according to some embodiments.

FIG. 8 is a block diagram of an electronic system including a nonvolatile memory device according to some embodiments of the present invention.

Referring to FIG. 8, an electronic system 400 may include a controller 410, an input/output device 420 and a memory device 430. The controller 410, the input/output device 420 and the memory device 430 may be coupled to each other through a bus 450. The bus 450 corresponds to a path through which data passes. The controller 410 may include at least one among a microprocessor, a digital signal processor, a microcontroller and logic devices which can perform a function similar to the microprocessor, the digital signal processor and the microcontroller. The input/output device 420 may include at least one selected from a keypad, a keyboard and a display device. The memory device 430 is a device used to store data. The memory device 430 can store data and/or commands executed by the controller 410. The memory device 430 may include a nonvolatile memory device disclosed in the embodiment described above. The electronic system 400 may further include an interface 440 used to transmit data to a communication network and/or to receive data from a communication network. The interface 440 may be a wire-type or a wireless-type. For example, the interface 440 may include an antenna, a wire transceiver or a wireless transceiver.

The electronic system 400 may be embodied in a mobile system, a personal computer, an industrial computer or a system performing various functions. For example, the mobile system may be a personal digital assistant (PDA), a portable computer, a web tablet, a mobile phone, a wireless phone, a laptop computer, a memory card, a digital music system or a data transmission/receipt system. In a case that the electronic system 400 is equipment which can perform a wireless communication, the electronic system 400 can be used in a communication interface protocol of a third generation communication system such as CDMA, GSM, NADC, E-TDMA, WCDMA, CDMA2000.

Figure 9:
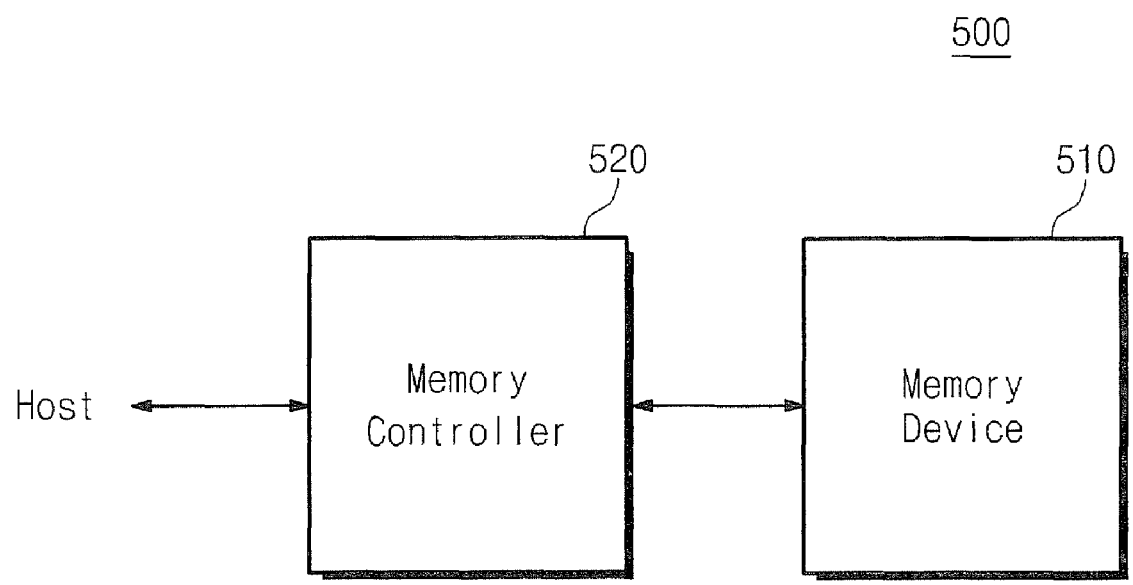
FIG. 9 is a block diagram of a memory card including a nonvolatile memory device according to some embodiments.

FIG. 9 is a block diagram of a memory card including a nonvolatile memory device according to some embodiments of the present invention.

Referring to FIG. 9, a memory card 500 includes a memory device 510 and a memory controller 520. The memory device 510 can store data. The memory device 510 may have a nonvolatile characteristic that retains the stored data even when a power supply is interrupted. The memory device 510 may include a nonvolatile memory device disclosed in the embodiment described above. The memory controller 520 can read out the stored data or store data in response to a request of decode/write of a host.

According to some embodiments, a charge storage pattern of an edge word line extends to be connected to an insulating layer of a peripheral line, such as an insulating layer of a select line or an insulating layer of a dummy line. When an erasing operation is performed, holes may be injected to the extended charge storage pattern of the edge word line to improve an erasing speed of the edge word line. Accordingly, a uniformity of threshold voltages of the word lines can be obtained without the necessity of increasing an erasing voltage.

What is claimed is:

1. A nonvolatile memory device comprising:
a word line group including a plurality of middle word lines and an edge word line having charge storage patterns on a substrate; and
a peripheral line disposed on one side of the word line group wherein the edge word line is between the peripheral line and the middle word lines, the peripheral line including a gate electrode and a gate insulating layer between the gate electrode and the substrate,
wherein the charge storage patterns of the middle word lines are separated from each other and a charge storage pattern of the edge word line extends on one side and connects to the gate insulating layer of the peripheral line.

2. The nonvolatile memory device of claim 1, wherein the extended charge storage pattern of the edge word line is configured to receive charges injected by a fringing electric field when an erasing operation is performed.

3. The nonvolatile memory device of claim 1, wherein the peripheral line comprises a dummy word line.

4. The nonvolatile memory device of claim 3, wherein the gate insulating layer of the dummy word line includes a material layer formed of the same material as the charge storage pattern of the edge word line and the charge storage pattern of the edge word line is connected to the material layer of the dummy word line.

5. The nonvolatile memory device of claim 3, further comprising a select line disposed on one side of the dummy word line, wherein the dummy word line is disposed between the word line group and the select line.

6. The nonvolatile memory device of claim 1, wherein the peripheral line comprises a select line.

7. The nonvolatile memory device of claim 6, wherein the gate insulating layer of the select line includes a material layer formed of the same material as the charge storage pattern of the edge word line and the charge storage pattern of the edge word line is connected to the material layer of the select line.

8. The nonvolatile memory device of claim 1, wherein each of the plurality of word lines includes a gate electrode disposed on a respective one of the charge storage patterns, wherein both side surfaces of the gate electrodes of the word lines, other than the edge word line, are coplanar with both side surfaces of the respective charge storage patterns, and wherein a side surface facing the middle word lines of the charge storage pattern of the edge word line is coplanar with a side surface of the gate electrode of the edge word line.

9. The nonvolatile memory device of claim 8, further comprising a spacer filling at least a lower portion of spaces between the middle word lines, a space between the edge word line and an adjacent one of the middle word lines and a space between the edge word line and the peripheral line.

10. The nonvolatile memory device of claim 1, wherein the word lines comprise gate electrodes disposed on respective ones of the charge storage patterns, the device further comprising spacers disposed on opposite sides of the gate electrodes of the word lines and the edge word line, wherein charge storage patterns of the middle word lines extend under the respective spacers by distances equal to widths of bottom surfaces of the respective spacers and wherein a charge storage pattern of the edge word line on a side of the charge storage pattern of the edge word line facing the middle word lines extends under the respective spacer by a distance equal to a width of a bottom surface of the respective spacer.

11. A nonvolatile memory device comprising:
a word line group including a plurality of middle word lines and a pair of edge word lines on opposite sides of the middle word lines, each of the middle word lines and the edge word lines including respective charge storage patterns and respective gate electrodes on the respective charge storage patterns; and
a peripheral gate electrode on the charge storage pattern of one of the edge word lines, wherein the edge word line is between the peripheral gate electrode and the middle word lines, and wherein the peripheral gate electrode is spaced laterally apart from the electrode of the at least one edge word line.

12. The nonvolatile memory device of claim 11, wherein the peripheral gate electrode comprises a gate electrode of a dummy word line.

13. The nonvolatile memory device of claim 12, further comprising a gate electrode of a select line on the charge storage pattern of the at least one edge word line, wherein the gate electrode of the dummy word line is between the gate electrode of the select line and the gate electrode of the at least one edge word line.

14. The nonvolatile memory device of claim 11, wherein the peripheral gate electrode comprises a gate electrode of a select line.

15. The nonvolatile memory device of claim 14, wherein the select line comprises a first select line, the device further comprising a second select line including a gate electrode on the charge storage pattern of the at least one edge word line.

16. The nonvolatile memory device of claim 15, further comprising a dummy gate electrode on the charge storage pattern of the at least one edge word line between the peripheral gate electrode and the gate electrode of the at least one edge word line.

17. The nonvolatile memory device of claim 11, further comprising insulating spacers on sidewalls of the edge word lines and the middle word lines, wherein the respective charge storage patterns of the edge word lines and the middle word lines extend beneath the respective insulating spacers.

18. The nonvolatile memory device of claim 17, wherein widths of the respective gate electrodes of the edge word lines and the middle word lines are smaller than widths of the corresponding charge storage patterns.

* * * * *